(12) United States Patent
Rinkiö

(10) Patent No.: US 10,284,142 B2
(45) Date of Patent: May 7, 2019

(54) ELECTRODE FOR A MICROELECTROMECHANICAL DEVICE

(71) Applicant: MURATA MANUFACTURING CO., LTD., Nagaokakyo-shi, Kyoto (JP)

(72) Inventor: Marcus Rinkiö, Rajamäki (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 144 days.

(21) Appl. No.: 15/260,493

(22) Filed: Sep. 9, 2016

(65) Prior Publication Data
US 2017/0207748 A1 Jul. 20, 2017

(30) Foreign Application Priority Data

Sep. 9, 2015 (FI) ...................................... 20155648

(51) Int. Cl.
*B81B 3/00* (2006.01)
*G01P 3/14* (2006.01)
(Continued)

(52) U.S. Cl.
CPC ............. *H03B 5/30* (2013.01); *B81B 3/0045* (2013.01); *G01C 19/5712* (2013.01); *G01P 3/14* (2013.01);
(Continued)

(58) Field of Classification Search
CPC .... G01P 15/125; G01P 15/0802; G01P 15/18; G01P 2015/082; G01P 2015/0831; G01P 3/14; B81B 2201/0235; B81B 3/0086; B81B 2201/0242; B81B 2203/0136; B81B 2203/04; G01C 19/5712; G01C 19/5755; G01C 19/5684; G01C 19/574; H03B 5/30
See application file for complete search history.

(56) References Cited

U.S. PATENT DOCUMENTS 7,015,060 B1 3/2006 Kubena et al.
7,325,451 B2 2/2008 Blomqvist
(Continued)

FOREIGN PATENT DOCUMENTS

EP 2 868 623 A1 5/2015
JP 2000-74675 A 3/2000
(Continued)

OTHER PUBLICATIONS

International Search Report international application No. PCT/IB2016/001271 dated Dec. 20, 2016.
(Continued)

*Primary Examiner* — Ryan Johnson
(74) *Attorney, Agent, or Firm* — Squire Patton Boggs (US) LLP

(57) ABSTRACT

A microelectromechanical device structure comprises a supporting structure wafer. A cavity electrode is formed within a cavity in the supporting structure wafer. The cavity electrode forms a protruding structure from a base of the cavity towards the functional layer, and the cavity electrode is connected to a defined electrical potential. The cavity electrode comprises a silicon column within the cavity in the supporting structure wafer, which is partially or entirely surrounded by a cavity. One or more cavity electrodes may be utilized for adjusting a frequency of an oscillation occurring within the functional layer.

17 Claims, 7 Drawing Sheets

(51) Int. Cl.
  *H03B 5/30* (2006.01)
  *G01P 15/08* (2006.01)
  *G01P 15/125* (2006.01)
  *G01C 19/5712* (2012.01)

(52) U.S. Cl.
  CPC .... *G01P 15/125* (2013.01); *B81B 2201/0235* (2013.01); *B81B 2201/0242* (2013.01); *B81B 2203/04* (2013.01); *G01P 2015/0822* (2013.01); *H03B 2201/0208* (2013.01)

(56) References Cited

U.S. PATENT DOCUMENTS

| | | | |
|---|---|---|---|
| 9,764,946 B2* | 9/2017 | Chen | B81B 3/0094 |
| 9,964,562 B2* | 5/2018 | Ogawa | G01C 19/5747 |
| 2004/0021403 A1 | 2/2004 | Ayazi et al. | |
| 2007/0220972 A1 | 9/2007 | Araki et al. | |
| 2010/0214643 A1 | 8/2010 | Ostrom | |
| 2011/0120221 A1 | 5/2011 | Yoda | |
| 2013/0019680 A1* | 1/2013 | Kittilsland | G01C 19/5712 73/504.12 |
| 2013/0175643 A1 | 7/2013 | Berthelot et al. | |
| 2013/0269434 A1 | 10/2013 | Kamisuki | |
| 2015/0053001 A1 | 2/2015 | Frey et al. | |

FOREIGN PATENT DOCUMENTS

| | | |
|---|---|---|
| JP | 2015-031645 A | 2/2015 |
| WO | WO 2015/036923 A1 | 3/2015 |

OTHER PUBLICATIONS

Finnish Search Report dated Mar. 2, 2016 corresponding to Finnish Patent Application No. 20155648.

J. Kyynarainen et al., "A 3D micromechanical compass," Sensors and Actuators A, 2008, vol. 142, No. 2, pp. 561-568.

* cited by examiner

ELECTRODE FOR A MICROELECTROMECHANICAL DEVICE

BACKGROUND

Field

The present invention relates to microelectromechanical devices. As a specific example of such microelectromechanical device, a gyroscope is presented.

Description of the Related Art

Micro-Electro-Mechanical Systems, or MEMS can be defined as miniaturized mechanical and electro-mechanical systems where at least some elements have a mechanical functionality. Since MEMS devices are created with the same tools used to create integrated circuits, micromachines and microelectronics can even be fabricated on the same piece of silicon to enable advanced devices.

MEMS structures can be applied to quickly and accurately detect very small changes in physical properties. For example, a microelectromechanical gyroscope can be applied to quickly and accurately detect very small angular displacements. Motion has six degrees of freedom: translations in three orthogonal directions and rotations around three orthogonal axes. The latter three may be measured by an angular rate sensor, also known as a gyroscope. MEMS gyroscopes use the Coriolis Effect to measure the angular rate. When a mass is moving in one direction and rotational angular velocity is applied, the mass experiences a force in orthogonal direction as a result of the Coriolis force. The resulting physical displacement caused by the Coriolis force may then be read with, for example, a capacitive, a piezoelectrical or a piezoresistive sensing structure.

In MEMS gyroscopes the primary motion is typically not continuous rotation as in conventional gyroscopes due to lack of adequate bearings. Instead, mechanical oscillation may be used as the primary motion. When an oscillating gyroscope is subjected to an angular motion orthogonal to the direction of the primary motion, an undulating Coriolis force results. This creates a secondary oscillation orthogonal to the primary motion and to the axis of the angular motion, and at the frequency of the primary oscillation. The amplitude of this coupled oscillation can be used as the measure of the angular rate.

Gyroscopes are very complex inertial MEMS sensors. The basic challenge in gyroscope designs is that the Coriolis force is very small and therefore the generated signals tend to be minuscule compared to other electrical signals present in the gyroscope. Spurious responses and susceptibility to vibration plague many MEMS gyro designs.

In an advanced prior art MEMS gyro design, such as the one described in U.S. Pat. No. 7,325,451, an external applied angular velocity is configured to induce to two parallel positioned planar seismic masses an opposite phase motion. This motion can be detected with linear capacitive comb electrodes. With the explicit oscillation directions of primary motion around Z-axis and detection motion around X-axis of the specific prior art configuration, the primary mode oscillation and the detection mode oscillation are effectively kept apart so that a robust sensor structure that is highly insensitive to external shocks has been provided.

In a cavity silicon on insulator (CSOI) MEMS device such as a sensing device like a gyroscope or any other type of microelectromechanical sensor, a layer of silicon called a structure wafer a.k.a. a functional layer is patterned to form majority of the functional parts of the microelectromechanical sensor device. Such functional parts may comprise for example movable parts such as seismic masses, springs and beams to guide the movements, excitation and detection structures, such as capacitive comb structures, and electrical connections thereof. Comb structures may be movable only partially, for instance one half of the comb is a moving electrode (rotor electrode) and another half forms a fixed electrode (stator electrode). In addition, non-movable support structures, such as suspension structures (anchors) may be formed in the functional layer. A handle wafer, a.k.a. a substrate forms typically a mechanically rigid support structure to the MEMS device. In conventional MEMS devices, the handle wafer is electrically passive part of the device. Typically a cover or cap, fixed to the substrate (a.k.a. handle wafer) encases the MEMS device structure, so that the substrate and the cap form together a casing that protects the MEMS sensor device against external conditions. Alternatively, the functional layer may include a fixed frame structure which provides walls for the casing formed by the substrate and the cap. Environmental protection may be needed for the functional parts of a MEMS device, which does not restrict movement of the movable parts of the structure. For example, in the above structure, the moving masses and the excitation structures are in the functional layer that is enclosed between the handle wafer and the cap wafer, and cavities are often created in the handle wafer and/or the cap wafer in order to allow the movable parts of the structure wafer to move without coming into contact with the protecting cap and/or substrate. Traditional accelerometers and gyroscopes have been considered as one of the easiest MEMS devices because they have no mechanical contact with outside world.

In the intended functional state, the primary mode oscillation and the secondary, detection mode oscillation frequencies of the gyroscope essentially coincide. However, due to non-ideal characteristics in the manufacturing process, either or both of said modes of oscillation may experience some deviation of the intended oscillation frequency, so that the frequencies of the modes do not quite coincide, which causes problems to the gyroscope functionality. The resonance frequency of either or both of said modes of oscillation may be electrically adjusted so that the two oscillation modes to essentially coincidence. This adjustment may be implemented by using capacitive electrodes placed orthogonally against the direction of the mode of oscillation that is to be adjusted. Then, the electrostatic force between the capacitive electrodes is primarily in the direction of the mode of oscillation that is to be adjusted. Essential coincidence means herein that the frequency separation of the two modes is approximately in the range of 0 to 100 Hz. Conventionally, the adjustment of frequency has been implemented using parallel plate combs in the functional layer, or with placing planar metal electrodes to the cap wafer. US patent application US2008016838 presents metal electrodes on a cap wafer.

US patent application US2004021403 presents a piezoelectric resonator with an arrangement for fine-tuning for the center frequency by applying a DC voltage to a capacitor located between a handle layer of the SOI substrate and the resonator body. A gap is created between the flat handle layer and the resonator body by etching away a layer of oxide between the two, so that the tuning effect is adjustable electrically.

As known by a person familiar with the art, the functional principle for implementing capacitive frequency adjustment may be based on electrostatic effect caused by change in capacitance between two electrodes having different electrical potentials. One electrode may be stationary and the other electrode may be moving, i.e. attached to a moving mass, or comprised of a moving mass. We refer to such moving electrode as a movable electrode. The capacitance between the two electrodes will change when the relative distance between the two electrodes changes, which in turn causes a changing electrostatic force between the two electrodes. This force may be adjusted dynamically by controlling the potential difference between the two electrodes. In a typical case, a DC bias voltage is fed to at least one of the electrodes for adjusting the frequency of the oscillation.

The problem relating to use of parallel plate combs for adjusting frequency in capacitive manner, is that they require relatively large amount of silicon area and thus make the functional element bigger, making the entire sensor device larger and bulkier. Also, large amount of parallel combs are often more susceptible to changes in their position due to external forces making the frequency adjustment more imprecise. In addition, parallel plate comb gap may vary in fabrication due to non-ideality of the fabrication process, inducing more variation to the electrostatic force needed to adjust the frequency. The problem with placing planar metal electrodes to the cap wafer is that this may require additional processing steps to the cap wafer. A problem in using metal electrodes attached to the cap wafer is that often the cap wafer is more susceptible to package induced distortions making the frequency adjustment more imprecise. In addition, in some manufacturing processes, cap wafer gap varies more in fabrication inducing more variation to the electrostatic force needed to adjust the frequency. Using a flat surface of the handle wafer as fine-tuning capacitor electrode lacks capability for adjusting the capacitor size and location compared to the moving electrode and hence lacks capability of adjusting the sensitivity of the frequency adjustment. Additionally very small distance between the handle wafer and the movable parts causes a risk of the two electrodes touching or even sticking with each other.

SUMMARY

Functional layer of a microelectromechanical device refers to a layer of the device comprising at least the moving parts of the device.

The term supporting structure wafer refers to a handle wafer and/or to a cap wafer. The supporting structure wafer forms a mechanically rigid support structure for the functional layer. A supporting structure wafer may comprise a single homogenous material layer, such as a silicon wafer, or it may comprise more than one homogenous wafer layers and layer parts attached to each other with a mechanically rigid, essentially non-flexible insulating material layer. An example of such insulating material layer useful for a silicon wafer is a silicon dioxide layer. Division of the supporting structure wafer in layers and/or layer parts with insulating material layer allows adjusting of the electrical potential of these parts individually.

The term base layer refers to a layer forming a mechanically stable and rigid part of a horizontally divided supporting structure wafer, which layer is aligned away from the functional layer. A surface of the base layer may form a flat outer surface of the microelectromechanical device. The term top layer refers to a layer of the horizontally divided supporting structure wafer, which layer is aligned towards the functional layer of the microelectromechanical device, thus residing between the base layer and the functional layer.

The top layer of a structure wafer may comprise functional parts interacting electrically with at least some parts of the functional layer. It should be understood, that terms base layer and top layer are defined by the position of the layer in relation to the functional layer and outer surface of the microelectromechanical device, and should not be understood as limiting the orientation of the layers as such.

The term cavity refers to a recessed area on a surface of an essentially flat wafer, such as a silicon wafer. A cavity may form a basin at a surface of the wafer. A cavity may be formed at a face of a supporting structure wafer. If the supporting structure wafer is horizontally divided, a cavity may be formed at a face of the top layer.

An object of the present invention is to provide a device and a method so as to overcome the prior art disadvantages. The objects of the present invention are achieved with a microelectromechanical device structure as disclosed herein.

The present invention is based on the idea of creating cavity electrodes for a microelectromechanical device within a supporting structure wafer. These cavity electrodes may be used for adjusting an oscillation frequency of a moving mass within the device.

According to a first aspect, a microelectromechanical device structure is provided, comprising at least a supporting structure wafer comprising first material and a functional layer and a cavity electrode of second material similar to the first material. The cavity electrode is formed within a cavity in the supporting structure wafer. The cavity electrode is electrically connected with at least one part of the supporting structure wafer. The cavity electrode and the at least one part of the supporting structure wafer are configured to be connected to a defined electrical potential.

According to a second aspect, the cavity electrode forms an integral part of an essentially homogenous structural material layer of the at least one part of the supporting structure wafer into which it is formed to.

According to a third aspect, the cavity electrode comprises a protruding structure from a base of the cavity towards the functional layer.

According to a fourth aspect, the cavity electrode comprises a silicon column within the cavity at least partially comprised in the at least one part of the supporting structure wafer.

According to a fifth aspect, the cavity electrode is disposed to be used as an electrode of a parallel plate capacitor, and the movable electrode of the parallel plate capacitor is associated with an essentially planar movable element in the functional layer of the device.

According to a sixth aspect, the parallel plate capacitor is disposed to be used for adjusting a frequency of a mechanical oscillation occurring in the microelectromechanical device.

According to a seventh aspect, the adjusting a frequency is effected by at least one of i) adjusting the electrical potential of the cavity electrode, and ii) adjusting the electrical potential of the movable electrode arranged in the functional layer. The frequency is adjustable by changing the relative DC potential between the two electrodes of the parallel plate capacitor.

According to an eighth aspect, the cavity electrode is configured to be connected to a set electrical potential through at least one electrically conductive plug arranged between the at least one part of the supporting structure wafer and the functional layer. The at least one electrically conductive plug extends through an insulating material layer between the at least one part of the supporting structure wafer and the functional layer.

According to a ninth aspect, the cavity electrode is configured to be connected to a set electrical potential through at least one electrically conductive plug arranged between a base layer of the supporting structure wafer and a top layer of the supporting structure wafer. The at least one electrically conductive plug extends through an insulating material layer between the base layer and the top layer of the supporting structure wafer.

According to a tenth aspect, the supporting structure wafer comprises at least one of a handle wafer and a cap wafer.

According to an eleventh aspect, the device structure comprises at least two cavity electrodes electrically connected to the same electrical potential.

According to a twelfth aspect, the device structure comprises at least two cavity electrodes electrically connectable through at least two electrically conductive plugs to at least two different electrical potentials, and the respective supporting structure wafer is divided by an electrically isolating structure material layer into at least two parts, the at least two parts comprising at least one part for each cavity electrode electrically connectable to different electrical potentials.

According to a thirteenth aspect, at least one detection electrode formed within the functional layer is placed on the cavity electrode, the at least one detection electrode being electrically isolated from the cavity electrode by an insulating material layer.

According to a fourteenth aspect, at least one suspension structure formed within the functional layer is disposed on the cavity electrode, the at least one suspension structure being electrically isolated from the cavity electrode by an insulating material layer.

According to a fifteenth aspect, the device comprises a sensor.

According to a sixteenth aspect, the device comprises a gyroscope.

According to another aspect, a method of adjusting a frequency of a mechanical oscillation occurring in a microelectromechanical device, said method comprising providing the micromechanical device structure according to any of the above aspects and adjusting the frequency of the mechanical oscillation. The adjusting comprises at least one of adjusting the electrical potential of the cavity electrode and adjusting the electrical potential of the movable electrode arranged in the functional layer. The frequency is adjustable by changing the relative DC potential between the two electrodes of the parallel plate capacitor.

The present invention has an advantage that a cavity electrode created within a supporting structure wafer is mechanically stable, which makes the frequency adjustment stable and less susceptible to distortions caused by packaging of the element than in the known solutions with electrodes within the functional layer or metal electrodes in the cap wafer, and thus the resonance frequency of the microelectromechanical sensor element may be adjusted with precision. Especially the handle wafer is known to be a mechanically stable, rigid structure, and it provides thus a preferred option for placement of cavity electrodes. However, in some manufacturing processes, the cap wafer may be sufficiently rigid and stable to function as cavity electrode location, and in some embodiments, the thickness of the cap wafer may be increased in order to make it more suitable for cavity electrode placement. Further, mechanically or electrically functional elements of the functional layer, such as suspension structures, a.k.a. anchor points, and detection electrodes may be placed on (above or below) the cavity electrode without electrical (galvanic) contact to the cavity electrode. An insulator material layer is provided between the cavity electrode and the functional element for electrically isolating the functional element, later referred to as an isolated functional element, from the cavity electrode. For simplicity, we will use term "on" indicating such stacking of structures, even if at least one intermediate layer of material such as insulator material layer would be provided in between. If such isolated functional element is created on the cavity electrode, a galvanic contact may be provided to the isolated functional element via the opposite wafer. If an isolated functional element resides on the handle wafer, a galvanic contact may be provided from the cap wafer side, and if an isolated functional element resides on the cap wafer, a galvanic contact may be provided from the handle wafer side. Such galvanic contact may be used for example for obtaining an electrical signal detected with an isolated detection electrode. On the other hand, if the isolated functional element placed on the cavity electrode is an anchor structure or a suspension structure, no electrical/galvanic connection is necessarily needed.

Presented solution using at least one cavity electrode improves the quality factor (Q-value) of achievable out-of-plane motion of the elements in the functional layer from known solutions. By appropriately choosing the location and/or the size of the cavity electrode, effectivity of the frequency adjustment may be adjusted, and unwanted contacts between the electrodes during functional part movement and sticking of the electrodes may be avoided.

BRIEF DESCRIPTION OF THE DRAWINGS

In the following the invention will be described in greater detail, in connection with preferred embodiments, with reference to the attached drawings, in which.

DETAILED DESCRIPTION

In the disclosed embodiments, solutions will be illustrated in which one or more cavity electrodes are provided in the handle wafer. Similar cavity electrode structures may alternatively be provided in a cap wafer, which could be illustrated by switching the structure upside down. While the embodiments are illustrative only, the dimensions may deviate from those of an actual physical device.

Figure 1A:
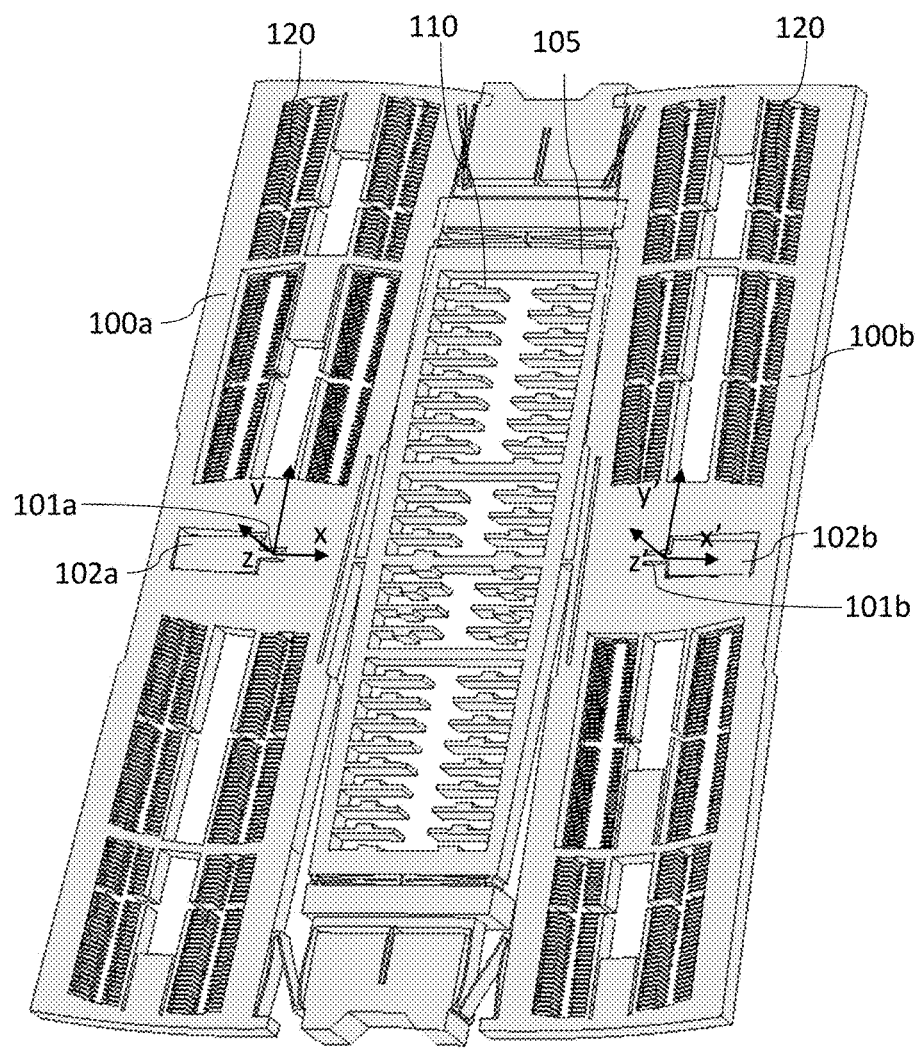
FIG. 1a shows a gyroscope structure in primary motion.
Figure 1B:
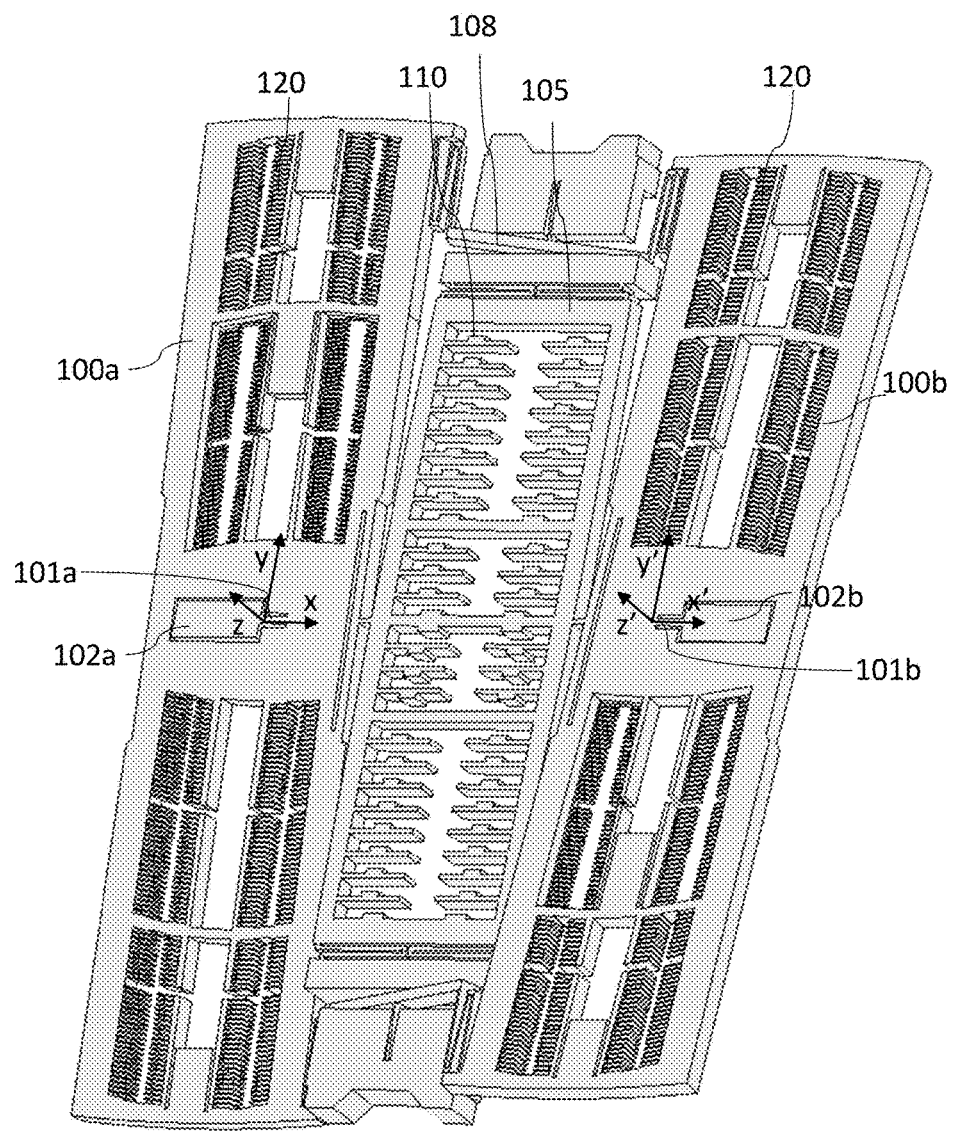
FIG. 1b shows the same gyroscope structure in secondary motion.

FIGS. 1a and 1b illustrate a functional layer of an exemplary gyroscope structure in which the invention may be applied. FIG. 1a illustrates an exemplary primary motion of such gyroscope structure, and FIG. 1b illustrates a secondary motion. For illustrative purposes, magnitude of movement of the masses has been exaggerated somewhat, so that some masses may appear to overlap especially in the primary motion. In a practical device, actual motion magnitudes (amplitudes) are smaller, so that no overlapping occurs for elements in the same plane.

An exemplary gyroscope structure includes a planar first seismic mass (100a), a planar second seismic mass (100b), and a first spring structure (101a, 101b) arranged with suspension structure (102a, 102b) for suspending the first seismic mass (100a) and the second seismic mass (100b) on an another body element (not shown), wherein the plane of the first seismic mass (100a) and the plane of the second seismic mass (100b) form a reference plane of the device. This reference plane corresponds to the plane of the masses when in rest, i.e. not excited to any movement. Said another body element may be for instance a handle wafer or a cap wafer. The two seismic masses (100a, 100b) are in parallel position with respect to each other: in rest, their longer edges are essentially aligned along two parallel axes (y, y') that are separated by a non-zero distance.

The microelectromechanical gyroscope structure includes also excitation means (110), and first detection means (120). In the current example, excitation means (110) comprise capacitive linear comb structures. FIGS. 1a and 1b present only the moving half of excitation linear comb structures, while the fixed parts of the combs forming the counterpart fixed electrode of the linear comb structure are not shown for clarity reasons. A person familiar with the art understands how excitation combs function. Instead of such linear comb structures, piezoelectric elements may be used for excitation. As known by a person familiar with the art, piezoelectric excitation occurs typically with excitation means that are attached to springs.

The first spring structure includes a first suspension structure (102a) within the plane of the first seismic mass (100a) for attaching the first seismic mass (100a) to the other body element, such as the handle wafer or the cap wafer, and a first spring assembly (101a) attached between the first suspension structure (102a), also called as an anchor or an anchor point, and the first seismic mass (100a), which first spring assembly (101a) enables rotary oscillation of the first seismic mass (100a) about a first excitation axis (z) perpendicular to the plane of the device. The first spring structure further includes a second suspension structure (102b) within the plane of the second seismic mass (100b) for attaching the second seismic mass (100b) to the other body element, such as the handle wafer or the cap wafer, and a second spring assembly (101b) attached between the second suspension structure (102b), also called as an anchor or an anchor point, and the second seismic mass (100b), which second spring assembly enables rotary oscillation of the second seismic mass (100b) about a second excitation axis (z') perpendicular to the plane of the device. Approximate location of the first excitation axis (z) and the second excitation axis (z') have been marked in the drawing for visualization. The first excitation axis (z) and the second excitation axis (z') are separated by a non-zero distance within the plane of the device (xy-plane).

The first spring assembly enables also rotary oscillation of the first seismic mass (100a) about a first detection axis (x) that is in the plane of the device, and the second spring assembly enables also rotary oscillation of the second seismic mass (100b) about a second detection axis (x') that is in the plane of the device. The first detection axis (x) and the second detection axis (x') are aligned with a common secondary axis (not marked). This rotary oscillation may be called as secondary oscillation of the gyroscope, caused by the Coriolis effect. The secondary oscillation is illustrated in FIG. 1b.

The excitation means (110) are configured to drive the first seismic mass (100a) and the second seismic mass (100b) to oscillate in opposite phase about the first and second excitation axes (z, z') respectively.

The detection means (120) are configured to detect the rotary oscillation of the first seismic mass (100a) about the first detection axis (x) and the rotary oscillation of the second seismic mass (100b) about the second detection axis (x'). Preferably, the rotary oscillation of the first and second seismic masses are in opposite phase.

In the presented exemplary device, the excitation action has been implemented with linear comb structures (110), and detection action of both the primary and secondary oscillation has also been implemented with linear comb structures. When both the excitation oscillation and the detection oscillation of the two seismic elements (100a, 100b) occur in opposite phases, the detection in this gyroscope may be fully differential, which enables high tolerance towards shock and vibration, and makes the device also insensitive towards disturbances caused by device packaging.

FIG. 1a illustrates the primary oscillation of the exemplary gyroscope device. The primary oscillation of the first and the second seismic masses (100a, 100b) is driven by the excitation means (110), which causes the excitation frame (105) to oscillate in essentially linear oscillation in y-axis direction, essentially in the plane of the device. A number of springs arranged between the excitation frame (105) and the first and the second seismic masses (100a, 100b) couple the oscillation of the excitation frame (105) to the seismic masses (100a, 100b), simultaneously changing the axis of the induced primary oscillation of the seismic masses (100a, 100b) so that their primary oscillation occurs essentially about the intended primary axes (z, z'), respectively.

FIG. 1b illustrates the secondary oscillation of the gyroscope device, caused by the Coriolis force affecting on the first and the second seismic masses (100a, 100b) when in primary oscillation. Coupling levers (108) coupled between the first seismic mass (100a) and the second seismic mass (100b) cause the phases of secondary oscillations of the seismic masses (100a, 100b) to be essentially opposite from each other.

Although carefully designed, the gyroscope described in FIGS. 1a and 1b may have a problem that the frequency of the primary and the secondary oscillations of the seismic masses (100a, 100b) are not the same, but dispersion is introduced to the frequencies due to non-idealities of the manufacturing process. This in turn can induce at least one of gain variation and offset. A solution to this problem was found by introducing cavity electrodes, which may be used to adjust the frequency of the secondary oscillation. With a capacitive electrode causing an electrostatic force in z-axis direction, the frequency of the secondary oscillation may be reduced so that the two frequencies become essentially the same.

Figure 2:
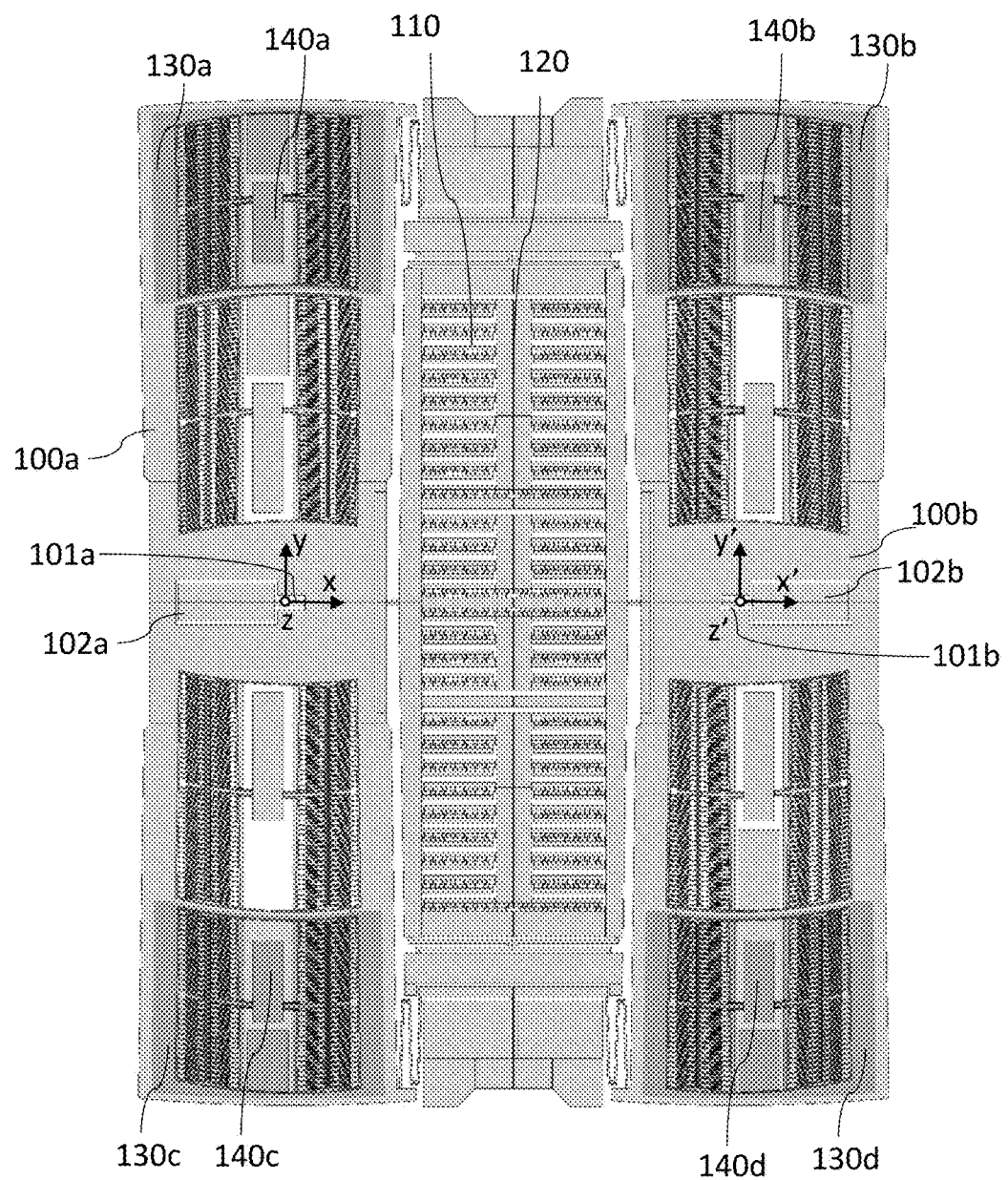
FIG. 2 shows a gyroscope structure with cavity electrodes.

FIG. 2 illustrates a gyroscope element with capability to adjust the z-axis directed oscillation frequency of the seismic masses (100a, 100b). In other words, the cavity electrodes are used to adjust frequency of oscillation occurring out of the plane of the device wafer. This capability is created by introducing a number of cavity electrodes (130a, 130b, 130c, 130d) for enabling electrical adjustment of the frequency of the detection motion. Material of the cavity electrodes (130a, 130b, 130c, 130d) is preferably electrically conductive. In FIG. 2, the locations of the exemplary cavity electrodes (130a, 130b, 130c, 130d) formed in the handle wafer underneath the functional layer (300) are marked with grey areas near each corner of the gyroscope element. Each cavity electrode (130a, 130b, 130c, 130d) acting as a fixed electrode forms an adjustable capacitive element with a movable electrode formed by either the area of the seismic mass located above it or the area of a planar electrode attached to the seismic mass (100a, 100b), so that the two form in practice a parallel plate capacitor. If no separate electrode is attached to the seismic mass (100a, 100b), the area of the seismic mass that is co-located (overlapping) with the respective cavity electrode (130a, 130b, 130c, 130d) acts as the movable electrode of the parallel plate capacitor. If an electrode is attached to the seismic mass (100a, 100b), the area of the attached electrode co-located (overlapping) with the respective cavity electrode (130a, 130b, 130c, 130d) forms the movable electrode of the capacitor. We will use term movable electrode for referring to an electrode associated with the seismic mass (100a, 100b) and moving with it, for example according to either of the above arrangements, or any alternative arrangement for associating a movable electrode to a seismic mass within the functional layer (300), where the movable electrode moves according to the movement of the seismic mass. Adjustment of frequency is effected by adjusting the potential difference between the two electrodes of this parallel plate capacitor formed by the movable electrode and the cavity electrode. Multiple parallel plate capacitors may be introduced in one gyroscope. In order to cause a symmetrical force on the respective seismic mass (100a, 100b), cavity electrodes (130a, 130b, 130c, 130d) are preferably placed symmetrically, on opposite sides of the axis of the oscillation that they are used to adjust. In this example, cavity electrodes 130a and 130c are placed symmetrically underneath the first seismic mass (100a) with respect to the x-axis, equally long distance away from the x-axis, and cavity electrodes 130b, 130d are placed symmetrically underneath the second seismic mass (100b) with respect to the x'-axis, equally long distance away from the x'-axis.

In one embodiment, the fixed cavity electrodes (130a, 130b, 130c, 130d) may be set to ground potential (0V) and the DC potential of the electrode on the moving seismic mass (100a, 100b) side is adjusted for frequency tuning purposes. This arrangement has the benefit that while the cavity electrode (130a, 130b, 130c, 130d) is part of the handle wafer that forms significant part of the outer surface of the element, no non-zero DC potential is visible on the outer surface of the device. However, for frequency adjustment purposes, only the relative potential between the two electrodes matter, and the electrical potential of each cavity electrode (130a, 130b, 130c, 130d) may be alternately set to any electric potential. Electric potential of both or either of the electrodes of each capacitive electrode pair may be made adjustable. When the potential difference between the fixed cavity electrodes and movable electrodes doesn't change, the force between the two electrodes changes depending on the distance between the two electrodes.

In the parallel plate capacitor arrangement as described, the frequency $f_{0e}$ of the resonator is proportional to square of the potential between the parallel plate capacitor electrodes as follows:

$$f_{0e} = f_0 \sqrt{1 + a_{vcf} V^2}, \quad (1)$$

where $f_0$ is the natural frequency of the oscillator, $a_{vcf}$ is the voltage coefficient of frequency and V is the potential difference.

In the described arrangement, the plate electrodes of the parallel plate capacitor are formed by two essentially planar electrodes in two different planes that are aligned with the plane of the seismic mass, and the force caused by this capacitor has direction (z, z') that is perpendicular to the plane of the seismic masses/the plate electrodes. Thus, the parallel plate capacitor creates a force which affects the detection (secondary) oscillation occurring out of the plane of the device (the plane formed by the device layer), and adjusting the relative potential of the electrodes will change the frequency of the detection oscillation. While the excitation oscillation occurs in direction of the plane of the plates of the capacitor, i.e. in the plane of the seismic masses, the change in the parallel plate capacitor does not change the frequency of the primary (excitation) oscillation (about z- and z'-axis).

In an alternative device, the directions of the driving and detection oscillations may be selected differently; if the driving oscillation would occur in z-axis direction out of the plane of the seismic mass, the parallel plate capacitor would affect the frequency of the driving oscillation. It can be understood, that an electrical potential caused between electrodes of the planar capacitor formed by the cavity electrode (130a, 130b, 130c, 130d) having a direction that is similar to the plane of the seismic mass, and the electrode formed by or attached to the planar seismic mass effectively in the plane of the seismic mass, will cause a force that affects the movement of the seismic mass (100a, 100b) that is perpendicular to the direction of the planes (xy) of the two electrodes, and this force may be used for adjusting the frequency of the movement of the seismic masses (100a, 100b).

The exemplary design also includes further sensing electrodes (140a, 140b, 140c, 140d) that are located in the functional layer within area of the respective cavity electrode (130a, 130b, 130c, 130d). The cavity electrode arrangement allows placing additional functional parts, either electrical or mechanical) on the cavity electrodes (130a, 130b, 130c, 130d). In this example, a secondary sensing electrode (140a, 140b, 140c, 140d) is arranged on each cavity electrode (130a, 130b, 130c, 130d), and is electrically isolated from the cavity electrode (130a, 130b, 130c, 130d), i.e. having no galvanic connection with the cavity electrode (130a, 130b, 130c, 130d). The secondary sensing electrode is an example of an isolated functional element. Isolation may be based on an insulating material layer between the cavity electrode and the respective secondary sensing electrode placed on the cavity electrode. Such arrangement allows device designs saving required silicon area. Instead of a sensing electrode, a suspension structure could be placed on a cavity electrode (130a, 130b, 130c, 130d). This kind of solution will bring more flexibility in the design of the functional layer of the device.

In the described exemplary gyroscope, the excitation oscillation may experience some quadrature movement caused by the rotating seismic mass moving in the plane of the seismic mass above the cavity electrode, causing secondary signal components to the phase of the excitation oscillation. This slight addition to quadrature movement in the excitation oscillation may be compensated in other known ways that are out of the scope, and thus not described here.

Figure 3:
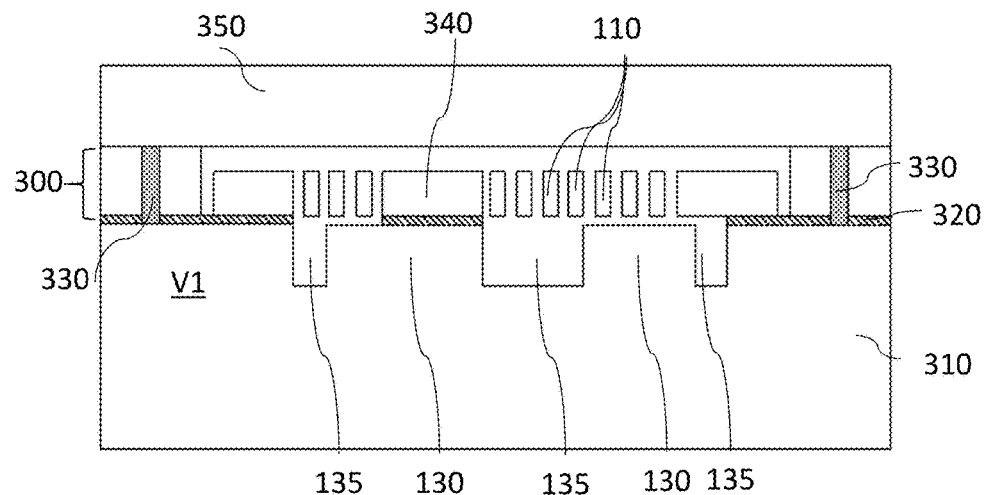
FIG. 3 shows a cross section of a first exemplary microelectromechanical sensor device comprising cavity electrodes.

FIG. 3 illustrates a first exemplary cross-section of a microelectronic device with cavity electrodes (130). The cavity electrodes (130) comprise of protruding structures, for example silicon columns on the handle wafer, placed underneath the seismic masses. As mentioned earlier, these cavity electrodes comprise electrically conducting material. In an embodiment, the material of the cavity electrodes comprises material similar to the material of the supporting structure wafer into which the cavity electrode (130a, 130b, 130c, 130d) is formed. Each cavity electrode (130) form a protruding structure from a base of a cavity (135) on a face of the supporting structure wafer, such as the handle wafer (310) towards the functional layer (300). Position, shape and size of the silicon columns is fully adjustable. Further, the gap between the functional layer (300) and the cavity electrode (130) is fully adjustable, since the height of the silicon column forming the cavity electrode (130) and the thickness and/or recession of structures within the functional layer is also adjustable in the manufacturing process. These silicon columns may be manufactured with a process removing material around the silicon column when forming a cavity in the handle wafer for example in an etching process, or the column may be built by surface micromachining the handle wafer, adding layer(s) of material for forming the silicon column within the cavity area.

In a traditional MEMS device, the handle wafer (310) is an electrically passive mechanical structure, which is not connected to any specific electrical potential, but has a floating potential. An insulating silicon oxide layer (320) between the handle wafer (310) and the functional layer (300) separates the two electrically. By introducing at least one electrically conductive plug structure (330) between at least one structural element comprised in the functional layer (300) and the handle wafer (310), the handle wafer (310) may be connected to a defined electrical potential (V1). At least one electrically conductive plug structure (330) may extend through the insulating material layer, such as a silicon oxide layer (320) between the functional wafer (300) and the handle wafer (310). A cap (350) covers the functional layer (300). The cavity electrode/s (130), created on the handle wafer (310) that is underneath the functional wafer (300), have to have a suitable distance from the movable elements of the device wafer (300) within a cavity (135) created underneath the movable elements allowing the movable elements the necessary room for oscillation movement. It should be understood, that areas shown as different cavities (135) in this cross-section may actually be part of the same cavity, surrounding at least one of the cavity electrodes (130). On the other hand, the cavity electrode (130) may be only partially surrounded by a cavity (135). The cavity electrode (130) may be connected through at least one electrically conductive plug (330) to a defined electrical potential (V1) against which the potential of the electrode formed by or attached to the movable element may be adjusted. In this example, the handle wafer (310) comprising the cavity (135) with at least one cavity electrode (130) is thus also connected to the same defined electrical potential (V1). It should be noticed that such electrically conductive plug (330) does not necessarily couple directly to the cavity electrode (130) itself, but may connect anywhere within the part of the supporting structure wafer which is electrically connected to the cavity electrode (130). The difference between these electrical potentials causes the force that can be utilized for adjusting the frequency of the oscillation.

In a further embodiment, further functional elements (340) of the functional layer may be mechanically attached on the cavity electrode (130). The insulating material layer (320) preferably exists between the cavity electrode (130) and the further functional element (340), so that the functional elements (340) are electrically isolated from the cavity electrode (130). For example, the functional element (340) may be a sensing electrode (140) or a suspension structure (i.e. 102a, 102b) for suspending any functional element such as the seismic mass may be placed on the cavity electrode (130).

In one embodiment, the whole handle wafer is connected to same electrical potential.

Figure 4:
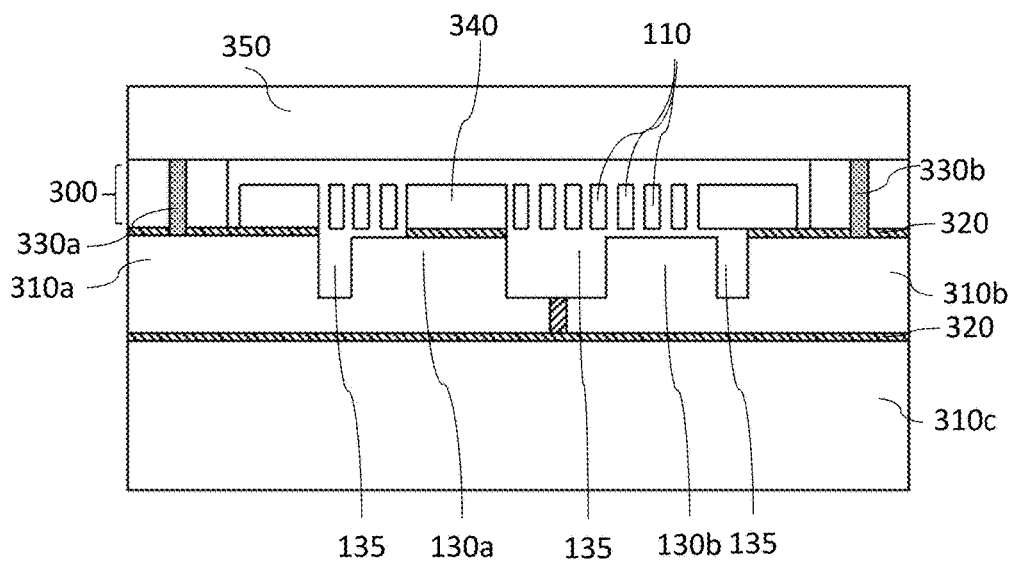
FIG. 4 shows a cross section of a second exemplary microelectromechanical sensor device comprising cavity electrodes that may have mutually different electrical potentials.

FIG. 4 illustrates a second embodiment, and more specifically a simplified exemplary cross-section of a microelectronic device with cavity electrodes (130a, 130b). In this second embodiment, the handle wafer (310) is divided to at least two electrically isolated parts, which may be connected to different electrical potentials (V1, V2). This way the forces effecting the moving elements of the device caused by cavity electrodes (130a, 130b) having different potential differences in different parts of the sensor device may be caused to be different from each other.

In the embodiment shown in FIG. 4, the handle wafer (310) has been divided into at least three main handle wafer parts (310a, 310b, 310c), which are electrically isolated from each other by a layer of electrically insulating material (320), such as silicon dioxide. Any other suitable isolation material may be selected. A divided the handle wafer (310) may include at least two layers: a base layer (310c) which forms a flat, electrically isolated and mechanically rigid body for the handle wafer, and a top layer formed by at least two top layer parts (310a, 310b), any or each of which may include any number of cavities (135) and cavity electrodes (130a, 130b). As shown in FIG. 4, each of these electrically separated top layer parts (310a, 310b) may be electrically connected with at least one electrically conductive plug (330a, 330b) to defined electrical potentials respectively. Thus, the cavity electrodes (130a, 130b) may have mutually different electrical potentials. A part of the handle wafer (310a; 310b) comprising at least a part of a cavity (135) with at least one cavity electrode (130a; 130b) in it is thus connected to the same defined electrical potential with the respective cavity electrode (130a; 130b). Electrical potentials of the two top layer parts (310a, 310b) of the handle wafer (310) may be mutually the same or they may be different. It should be noticed that arrangements related to the cap wafer (350) for distributing electrical potentials towards the electrically conductive plugs (330a, 330b) are not shown in the figure.

A divided handle wafer (310) structure as illustrated in FIG. 4 may be manufactured by attaching two planar element wafers with each other. Manufacturing process includes steps for separating electrically the two separated top layer parts (310a, 310b) from each other. For example, the manufacturing process may include generation of a groove extending over the entire thickness of the top layer in order to divide the wafer layer forming the top layer into parts corresponding to said electrically separated top layer parts (310a, 301b) in vertical dimension, and filling this groove with insulating material. Attaching the base layer (310c) with the top layer (310a and 310b) for forming the handle wafer (310) may be implemented with any process known by a person familiar in the art. For example, fusion bonding process, may be used. Attaching the base layer and the top layer may occur before or after dividing the top layer into electrically separated top layer parts.

Figure 5:
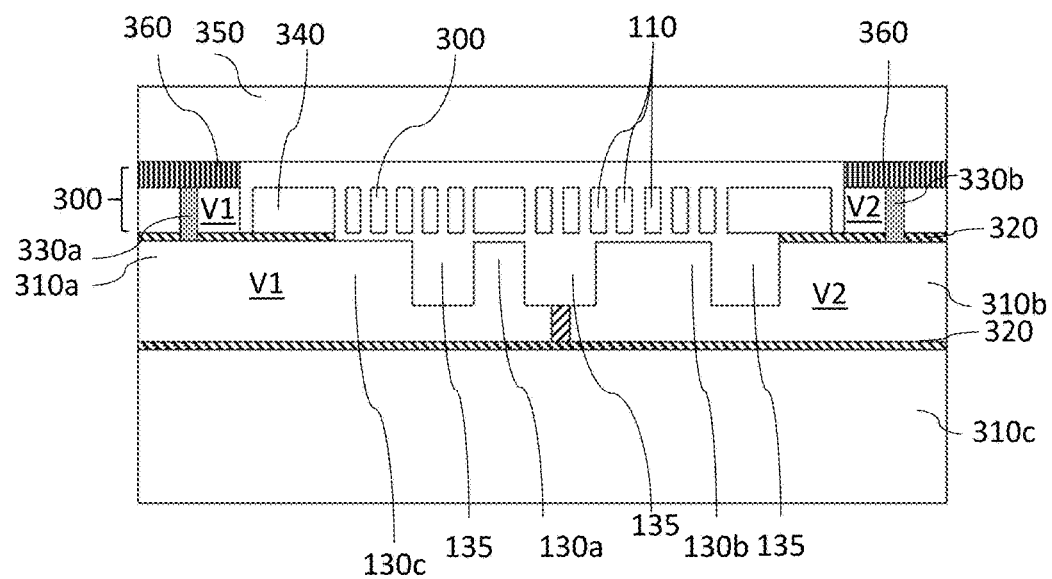
FIG. 5 shows a cross section of a third exemplary microelectromechanical sensor device comprising cavity electrodes that may have mutually different electrical potentials, with a glued cap wafer.

FIG. 5 illustrates a third, simplified exemplary cross-section of a microelectronic device with cavity electrodes (130a, 130b, 130c). As in the second embodiment, in this third embodiment, the handle wafer (310) is also divided to at least two electrically isolated parts, which may be connected to different electrical potentials. This way the forces caused by cavity electrodes (130a, 130c; 103b) having different potential differences in different parts of the sensor device may be caused to be differing from each other.

In the embodiment of FIG. 5, one of the cavity electrodes (130c) is not fully surrounded by a cavity, but electrode is partially attached to the handle wafer (310). Preferably, the cavity electrode (130) is however encircled by a cavity (135) from at least two sides. In similar manner, although not shown in this example, two cavity electrodes (130) may be connected to each other.

FIG. 5 also presents an embodiment where the cap wafer (350) is attached to the device wafer (300) with a layer of glue (360), glass, or any other suitable material capable of attaching silicon wafer layers with each other, and enclosing the movable parts of the device hermetically from the external environment.

Figure 6:
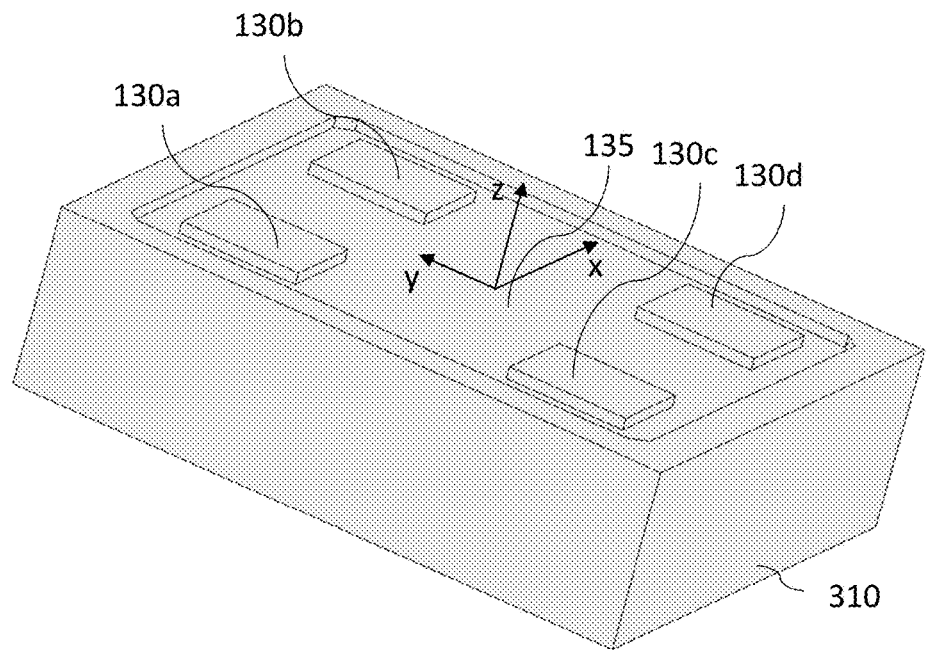
FIG. 6 illustrates a handle wafer with a cavity and a number of cavity electrodes.

FIG. 6 illustrates a perspective view of a handle wafer (310) with a cavity (135) and four cavity electrodes (130a, 130b, 130c, 130d). This may be considered representing handle wafer (310) in FIG. 2, except that no suspension structures (anchors) are shown. Position, shape and size of the cavity electrodes (130a, 130b, 130c, 130d) may be adjusted. Size of the area of the cavity electrodes (130a, 130b, 130c, 130d) overlapping laterally with the movable electrode in the material layer above will have direct effect on the capacitive force between the two electrodes. Moving the cavity electrodes (130a, 130b, 130c, 130d) in y-axis direction will change the effective force caused by the electrostatic force between the rotor electrode and the corresponding cavity electrode (130a, 130b, 130c, 130d). This is because the length of the axis of the momentum caused by the force will change along y-axis in this exemplary arrangement. Moving the cavity electrodes (130a, 130b, 130c, 130d) within the cavity (135) along x-axis does not change the force as long as the cavity electrode (130a, 130b, 130c, 130d) remains entirely under the rotor electrode including the rotor mass and the electrical combs attached to it.

It should be understood that the effective changes on forces caused by the capacitive electrode explained above relate to the specific sensor device illustrated in FIGS. 1a, 1b, and 2.

Figure 7:
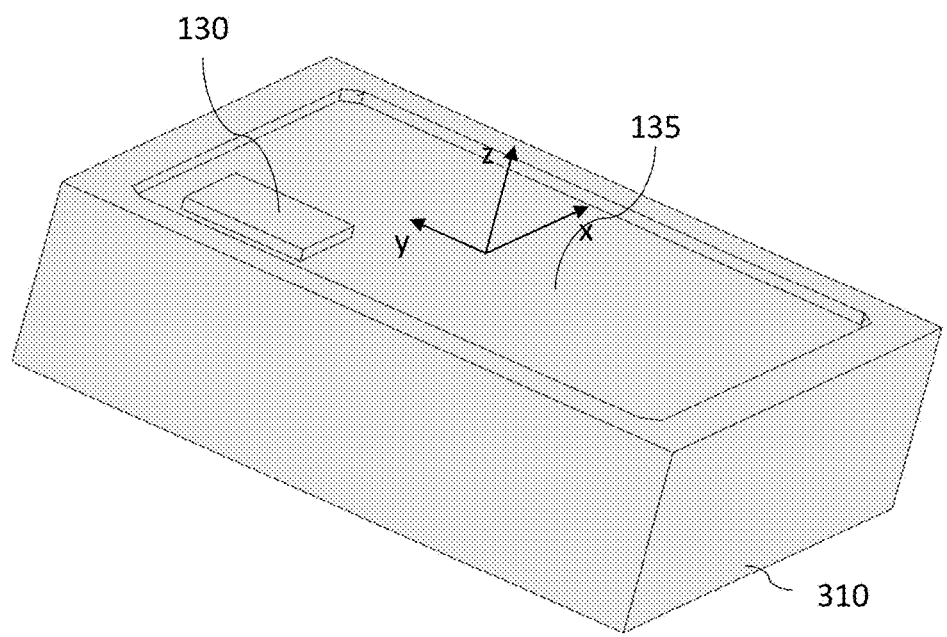
FIG. 7 illustrates a handle wafer with a cavity and a cavity electrode.

FIG. 7 illustrates a perspective view of a handle wafer (310) with a cavity (135) and one cavity electrode (130). It should be understood that any number, shape or position of cavity electrodes may be created without departing from the scope.

In another further embodiment, further functional elements (340) of the functional layer may be mechanically attached on the cavity electrode. The insulating material layer (330) preferably exists between the cavity electrode (130) and the further functional element (340) so that the functional elements (340) are electrically insulated from the cavity electrode. For example, the functional element (340) may be a sensing electrode (140), excitation structure (110) or a suspension structure (i.e. 102a, 102b) for suspending any functional element such as the seismic mass may be placed on the cavity electrode (130)

It should be noticed, that although all above examples have the cavity electrodes structures on the handle wafer (310), similar electrodes may be introduced to the cap wafer (350). In order to achieve mechanically rigid cap wafer (350) the thickness of the cap wafer (350) may need to be suitably adjusted.

Figure 8:
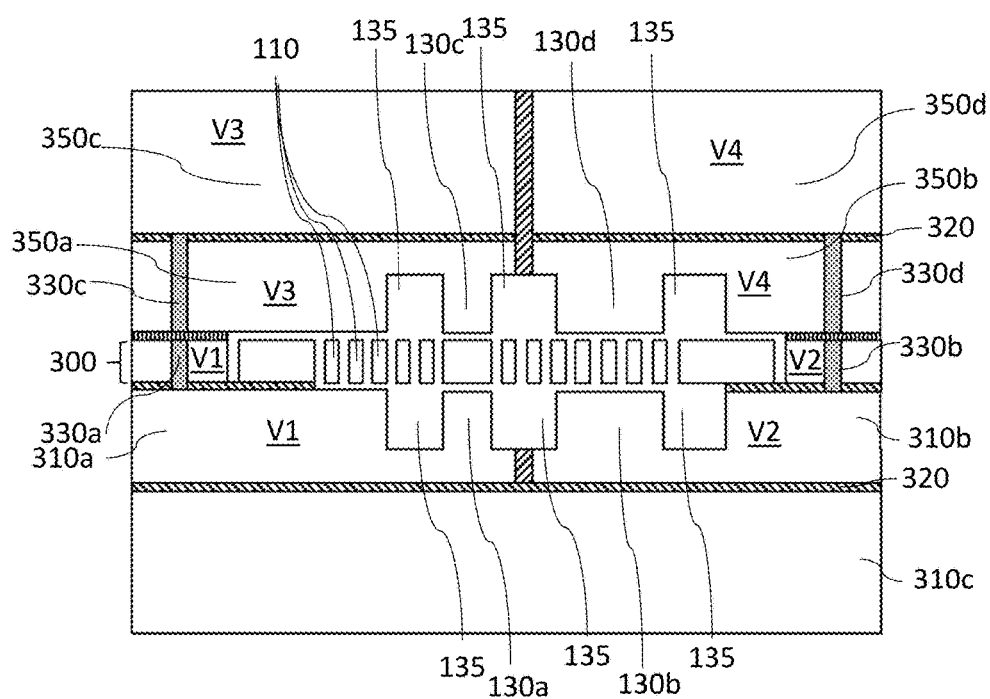
FIG. 8 illustrates a cross section of a fourth exemplary microelectromechanical sensor device comprising cavity electrodes both in the handle wafer and in the cap wafer.

FIG. 8 illustrates a cross-section of a fourth exemplary embodiment of a microelectromechanical device, with cavity electrodes both in the handle wafer (310) and in the cap wafer (350). In this embodiment we can also see that both the handle wafer and the cap wafer have been divided into multiple parts. This example shows a divided handle wafer (310) divided into three main handle wafer parts (310a, 310b, 310c), which are electrically isolated from each other by a layer of electrically insulating material (320), such as silicon dioxide. We can also see a divided cap wafer (350) divided into four main cap wafer parts (350a, 350b, 350c, 350d), which are electrically isolated from each other by a layer of electrically insulating material (320) in a similar manner to the handle wafer (310). Any other suitable isolation material may be selected. A divided handle wafer (310) and/or a divided cap wafer (350) may both include at least two layers: a base layer (310c; 350c, 350d) which forms a flat, electrically isolated and mechanically rigid body for the handle wafer (310) or the cap wafer (350) respectively, and at least two top layer parts (310a, 310b; 350a, 350b), which may include any number of cavities (135) and cavity electrodes (130a, 130b). The base layer (310c; 350c, 350d) may also be divided into more than one electrically isolated part as illustrated with base layer parts (350c, 350d) of the cap wafer. An example of this may be seen in the base layer of the cap wafer (350c, 350d), where an insulating material layer (320) also divides this layer into two electrically isolated parts. As shown in FIG. 8, each of the electrically separated top layer parts (310a, 310b) of the handle wafer (310) may be electrically connected with at least one electrically conductive plug (330a, 330b) to first and second defined electrical potentials (V1, V2) respectively. Thus, the cavity electrodes (130a, 130b) may have mutually different electrical potentials. It may further be noticed, that the same conductive plugs (330a, 33b) may also connect parts of the functional layer (300) to the respective electrical potentials (V1, V2). Electrical potentials of the two top layer parts (310a, 310b) of the handle wafer (310) may be mutually the same or they may be different. It should be understood that number of electrically insulated top layers in the handle (310) or cap wafer (350) is not limited to two, but more than two areas may be created on either wafer (310, 350) by placing electrically isolating material layer (320) between the areas. Cavity electrodes (130c, 130d) of the cap wafer (350) may also be connected into different potential through electrically conductive plugs or vias (330c, 330d). In the present exemplary embodiment, a third plug (330c) connects a base layer (350c) and top layer (350a) of the cap wafer (350) into a third defined electrical potential (V3) and a second plug connects a base layer (350d) and a top layer (350b) of the cap wafer (350) into a fourth defined electrical potential (V4). Defined electrical potentials (V1, V2, V3, V4) may be chosen freely, and any pair of these electrical potentials may comprise mutually same or different electrical potentials.

The microelectromechanical device, which may be a sensing device such as a gyroscope, is beneficially implemented using a well-known cavity silicon on insulator CSOI structure. On the other hand, similar process may be used for manufacturing other types of microelectromechanical devices, which may beneficially use a cavity electrode structure according to the invention. This structure comprises the handle wafer (310), a functional layer (300), a buried oxide layer (i.e. a silicon oxide layer) (320) creating an electrically insulating layer between the handle wafer (310) and the functional layer (300), and a cover or a cap (350), which may also be comprise a wafer. The handle wafer may contain more than one parts (310a, 310b, 310c) electrically separated by a further buried oxide layer (320). The functional layer (300) comprises at least all movable parts of the microelectromechanical device. Electrical connections and for example metal excitation and detection electrodes, may be arranged in any of the functional layer, the handle wafer and the cap. The cover or cap (350) fixed to the substrate (310) or to the functional layer (300) is added for enclosing the moving parts of the device inside a cavity, where they are protected from the environment, but the structural parts of the microelectromechanical device are capable of moving within free room created by the cavity.

A simplified description of process to manufacture a microelectromechanical device with a CSOI process begins by etching the cavities (135) to the handle wafer (310), the cavities comprising also the cavity electrodes (130) formed as silicon columns within the cavities (135). These cavity electrodes (130) form an integral part of the handle wafer (310), forming preferably part of an essentially homogenous structural material layer of the handle wafer (310). The handle wafer (310) is then attached with the structure wafer from which the functional layer (300) will be created. The handle wafer (310) may be constructed from more than one electrically isolated parts by dividing at least one layer of the handle wafer (310) with electrically isolating material, or by attaching such parts with each other with electrically isolating material prior to attaching the handle wafer (310) with the structure wafer. In either case, cavity electrodes (130) form an integral part of at least one of the electrically isolated parts of the handle wafer (310). Either or both of the wafers is covered with an insulating material layer (320), such as a silicon oxide layer (320) and the attaching is performed by fusion bonding so that the insulating material layer (320) is left between the two wafers (300, 310). The functional elements such as the seismic masses, springs and detection structures are then etched to the functional layer, and after the functional layer (300) has been created, the insulating material layer (320) is removed underneath the movable microelectromechanical functional structures with any suitable process known in the art. In this process, also the cavity electrode (130) is detached from the functional layer (300), and the sensing element has room for intended movement within the cavity (135). At least one electrically conductive plug (330) coupling the handle wafer (310) and the functional layer (300) electrically to each other may be created through any known method known by a man skilled in the art. In example, electrically conductive plugs (330) may be created in an etching process. A cap (350) is placed on top of the functional layer (300) to protect the functional parts from the environment. Although not shown in the simplified FIGS. 3 and 4, the cap (350) may also have cavities having sufficient cavity for allowing the movable parts of the functional layer (300) to move as intended. Further, cavity electrodes (130) may be placed in the cavities (135) within the cap wafer (350), in a similar manner as the handle wafer (310) does, as illustrated earlier in relation to FIG. 8. Manufacturing a cap wafer (350) comprising cavity electrodes (130) may be performed by etching. Further, a cap wafer (350) may be manufactured comprising at least two electrically isolated parts. This manufacturing process may be like the one used for manufacturing the handle wafer (310) as described above.

Another example approach to the process to manufacture a microelectromechanical device is to use epitaxial growth of polysilicon to form the device. Here the process begins with deposition and patterning of interconnections parallel to the plane of the seismic mass on a thermally oxidized substrate. The epitaxial polysilicon is grown on top of interconnects enclosed by an insulating layer and having opened connections to the epitaxial polysilicon for external signals. Sensing element is then patterned to epitaxial polysilicon functional layer and released from the excess insulator layer. Finally contact metallization is deposited and cap wafer containing cavities comprising also the cavity electrodes are attached to the structure wafer by wafer bonding.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical device structure, comprising:
    a supporting structure wafer comprising any one of a homogenous material layer and several homogenous material layers or layer parts attached to each other with a mechanically rigid insulating material layer;
    a functional layer comprising movable parts of the microelectromechanical device structure;
    wherein the supporting structure wafer forms a mechanically rigid support structure for the functional layer; and
    a cavity electrode,
    wherein the cavity electrode is formed within a cavity in a homogenous material layer or a homogenous material layer part of the supporting structure wafer so that the cavity electrode comprises a protruding structure from a base of the cavity towards the functional layer, and the cavity electrode forms an integral part of the homogenous material layer or layer part into which the cavity and the cavity electrode are formed, wherein the cavity electrode is electrically connected with the respective homogenous material layer or layer part of the supporting structure wafer, and wherein the cavity electrode and the respective homogenous material layer or layer part of the supporting structure wafer are configured to be connected to a defined electrical potential, wherein the cavity electrode is disposed to be used for adjusting a frequency of a mechanical oscillation occurring in the microelectromechanical device.

2. The microelectromechanical device structure of claim 1, wherein the cavity electrode comprises a silicon column within the cavity at least partially comprised in the respective single homogenous material layer or the respective one of the several homogenous material layers or layer parts of the supporting structure wafer.

3. The microelectromechanical device structure of claim 1, wherein the supporting structure wafer comprises at least one of:
    a handle wafer; and
    a cap wafer.

4. The microelectromechanical device structure according to claim 1, wherein the microelectromechanical device comprises a sensor.

5. The microelectromechanical device structure according to claim 1, wherein the microelectromechanical device comprises a gyroscope.

6. A microelectromechanical device structure, comprising:
a supporting structure wafer comprising any one of a homogenous material layer and several homogenous material layers or layer parts attached to each other with a mechanically rigid insulating material layer;
a functional layer comprising movable parts of the microelectromechanical device structure;
wherein the supporting structure wafer forms a mechanically rigid support structure for the functional layer; and
a cavity electrode,
wherein the cavity electrode is formed within a cavity in a homogenous material layer or a homogenous material layer part of the supporting structure wafer so that the cavity electrode comprises a protruding structure from a base of the cavity towards the functional layer, and the cavity electrode forms an integral part of the homogenous material layer or layer part into which the cavity and the cavity electrode are formed, wherein the cavity electrode is electrically connected with the respective homogenous material layer or layer part of the supporting structure wafer, and wherein the cavity electrode and the respective homogenous material layer or layer part of the supporting structure wafer are configured to be connected to a defined electrical potential,
wherein the cavity electrode is disposed to be used as an electrode of a parallel plate capacitor, and a movable electrode of the parallel plate capacitor is associated with a planar movable element in the functional layer of the microelectromechanical device, and
wherein the parallel plate capacitor is disposed to be used for adjusting a frequency of a mechanical oscillation occurring in the microelectromechanical device.

7. A method of adjusting a frequency of a mechanical oscillation occurring in a microelectromechanical device, said method comprising:
providing the micromechanical device structure according to claim 6; and
adjusting the frequency of the mechanical oscillation, said adjusting comprising at least one of:
adjusting the electrical potential of the cavity electrode; and
adjusting the electrical potential of the movable electrode arranged in the functional layer,
wherein the frequency is adjustable by changing the relative direct current potential between the two electrodes of the parallel plate capacitor.

8. A microelectromechanical device structure, comprising:
a supporting structure wafer comprising any one of a homogenous material layer and several homogenous material layers or layer parts attached to each other with a mechanically rigid insulating material layer;
a functional layer comprising movable parts of the microelectromechanical device structure;
wherein the supporting structure wafer forms a mechanically rigid support structure for the functional layer; and
a cavity electrode,
wherein the cavity electrode is formed within a cavity in a homogenous material layer or a homogenous material layer part of the supporting structure wafer so that the cavity electrode comprises a protruding structure from a base of the cavity towards the functional layer, and the cavity electrode forms an integral part of the homogenous material layer or layer part into which the cavity and the cavity electrode are formed, wherein the cavity electrode is electrically connected with the respective homogenous material layer or layer part of the supporting structure wafer, and wherein the cavity electrode and the respective homogenous material layer or layer part of the supporting structure wafer are configured to be connected to a defined electrical potential, wherein the cavity electrode is configured to be connected to a set electrical potential through at least one electrically conductive plug arranged between the at least one part of the supporting structure wafer and the functional layer, the at least one electrically conductive plug extending through an insulating material layer between the at least one part of the supporting structure wafer and the functional layer.

9. The microelectromechanical device structure of claim 8, wherein the device structure comprises at least two cavity electrodes electrically connected to the same electrical potential.

10. The microelectromechanical device structure of claim 8, wherein the device structure comprises at least two cavity electrodes electrically connectable through at least two electrically conductive plugs to at least two different electrical potentials, and the respective supporting structure wafer is divided by an electrically isolating structure material layer into at least two parts, the at least two parts comprising at least one part for each cavity electrode electrically connectable to different electrical potentials.

11. The microelectromechanical device structure according to claim 8, wherein the microelectromechanical device comprises a sensor.

12. The microelectromechanical device structure according to claim 8, wherein the microelectromechanical device comprises a gyroscope.

13. A microelectromechanical device structure, comprising:
a supporting structure wafer comprising any one of a homogenous material layer and several homogenous material layers or layer parts attached to each other with a mechanically rigid insulating material layer;
a functional layer comprising movable parts of the microelectromechanical device structure;
wherein the supporting structure wafer forms a mechanically rigid support structure for the functional layer; and
a cavity electrode,
wherein the cavity electrode is formed within a cavity in a homogenous material layer or a homogenous material layer part of the supporting structure wafer so that the cavity electrode comprises a protruding structure from a base of the cavity towards the functional layer, and the cavity electrode forms an integral part of the homogenous material layer or layer part into which the cavity and the cavity electrode are formed, wherein the cavity electrode is electrically connected with the respective homogenous material layer or layer part of the supporting structure wafer, and wherein the cavity electrode and the respective homogenous material layer or layer part of the supporting structure wafer are configured to be connected to a defined electrical potential, wherein the cavity electrode is configured to be connected to a set electrical potential through at least one electrically conductive plug arranged between a base layer of the supporting structure wafer and a top layer of the supporting structure wafer, the at least one electrically conductive plug extending through an insulating material layer between the base layer and the top layer of the supporting structure wafer.

14. The microelectromechanical device structure according to claim 13, wherein the microelectromechanical device comprises a sensor.

15. The microelectromechanical device structure according to claim 13, wherein the microelectromechanical device comprises a gyroscope.

16. A microelectromechanical device structure, comprising:
a supporting structure wafer comprising any one of a homogenous material layer and several homogenous material layers or layer parts attached to each other with a mechanically rigid insulating material layer;
a functional layer comprising movable parts of the microelectromechanical device structure;
wherein the supporting structure wafer forms a mechanically rigid support structure for the functional layer; and
a cavity electrode,
wherein the cavity electrode is formed within a cavity in a homogenous material layer or a homogenous material layer part of the supporting structure wafer so that the cavity electrode comprises a protruding structure from a base of the cavity towards the functional layer, and the cavity electrode forms an integral part of the homogenous material layer or layer part into which the cavity and the cavity electrode are formed, wherein the cavity electrode is electrically connected with the respective homogenous material layer or layer part of the supporting structure wafer, and wherein the cavity electrode and the respective homogenous material layer or layer part of the supporting structure wafer are configured to be connected to a defined electrical potential, wherein at least one detection electrode formed within the functional layer is disposed on the cavity electrode, the at least one detection electrode being electrically isolated from the cavity electrode by an insulating material layer and configured to detect at least one oscillation of a seismic mass comprised in the functional layer.

17. A microelectromechanical device structure, comprising:
a supporting structure wafer comprising any one of a homogenous material layer and several homogenous material layers or layer parts attached to each other with a mechanically rigid insulating material layer;
a functional layer comprising movable parts of the microelectromechanical device structure;
wherein the supporting structure wafer forms a mechanically rigid support structure for the functional layer; and
a cavity electrode,
wherein the cavity electrode is formed within a cavity in a homogenous material layer or a homogenous material layer part of the supporting structure wafer so that the cavity electrode comprises a protruding structure from a base of the cavity towards the functional layer, and the cavity electrode forms an integral part of the homogenous material layer or layer part into which the cavity and the cavity electrode are formed, wherein the cavity electrode is electrically connected with the respective homogenous material layer or layer part of the supporting structure wafer, and wherein the cavity electrode and the respective homogenous material layer or layer part of the supporting structure wafer are configured to be connected to a defined electrical potential, wherein at least one suspension structure formed within the functional layer is placed on the cavity electrode, the at least one suspension structure being electrically isolated from the cavity electrode by an insulating material layer.

* * * * *